(12) United States Patent
Pomar Pedredo et al.

(10) Patent No.: US 12,276,685 B2
(45) Date of Patent: Apr. 15, 2025

(54) MEASURING THE IMPEDANCE IN GROUNDING SYSTEMS

(71) Applicant: Aplicaciones Tecnologicas, S.A., Paterna (ES)

(72) Inventors: Verónica Pomar Pedredo, Paterna (ES); David Ruiz Muñoz, Paterna (ES); Julio Sánchez Jimeno, Paterna (ES)

(73) Assignee: APLICACIONES TECNOLOGICAS, S.A., Valencia (ES)

( * ) Notice: Subject to any disclaimer, the term of this patent is extended or adjusted under 35 U.S.C. 154(b) by 95 days.

(21) Appl. No.: 18/018,370

(22) PCT Filed: Jul. 29, 2020

(86) PCT No.: PCT/ES2020/070491
§ 371 (c)(1),
(2) Date: Jan. 27, 2023

(87) PCT Pub. No.: WO2022/023588
PCT Pub. Date: Feb. 3, 2022

(65) Prior Publication Data
US 2024/0036092 A1 Feb. 1, 2024

(51) Int. Cl.
*G01R 27/20* (2006.01)
*G01R 27/16* (2006.01)
(Continued)

(52) U.S. Cl.
CPC ............. *G01R 27/20* (2013.01); *G01R 27/16* (2013.01); *G01R 31/58* (2020.01);
(Continued)

(58) Field of Classification Search
CPC ........ G01R 27/20; G01R 31/58; G01R 27/16; H01M 8/0206; H01M 8/04559; H01M 8/04589; H01M 8/0662; H01M 8/249
(Continued)

(56) References Cited

U.S. PATENT DOCUMENTS

| | | | |
|---|---|---|---|
| 4,283,794 A | 8/1981 | Underhill et al. | |
| 2009/0230980 A1* | 9/2009 | Williams | G01R 27/32 324/707 |

(Continued)

FOREIGN PATENT DOCUMENTS

CN 1133878 C 8/1999

OTHER PUBLICATIONS

International Preliminary Report on Patentability, PCT/ES2020/070491, 11 pp. Oct. 7, 2022.
(Continued)

*Primary Examiner* — Raul J Rios Russo
(74) *Attorney, Agent, or Firm* — Danielson Legal LLC

(57) ABSTRACT

Procedure for measuring the impedance of a grounding system that comprises a loop, the procedure comprises for each frequency fi of a set of frequencies F of a frequency sweep applied to the loop of the grounding system, generating a modulating signal $S_{signal}$ (2) with a fixed frequency fm, generating a carrier signal $S_{carrier}$ (1) with the frequency fi, and obtaining an amplitude modulated signal $S_{modulated}$ (3) with frequency components of the frequencies fm and fi and based on $S_{signal}$ (2) and $S_{carrier}$ (1).

5 Claims, 4 Drawing Sheets

(51) Int. Cl.
*G01R 31/58* (2020.01)
*H01M 8/0206* (2016.01)
*H01M 8/04537* (2016.01)
*H01M 8/0662* (2016.01)
*H01M 8/249* (2016.01)

(52) U.S. Cl.
CPC ...... *H01M 8/0206* (2013.01); *H01M 8/04559* (2013.01); *H01M 8/04589* (2013.01); *H01M 8/0662* (2013.01); *H01M 8/249* (2013.01)

(58) Field of Classification Search
USPC ........................................................ 324/650
See application file for complete search history.

(56) References Cited

U.S. PATENT DOCUMENTS

| | | | |
|---|---|---|---|
| 2010/0327887 A1 | 12/2010 | Denison et al. | |
| 2012/0170632 A1* | 7/2012 | Walker | H04B 17/10 375/224 |
| 2013/0099800 A1* | 4/2013 | Francis | G01R 27/02 324/650 |
| 2013/0191059 A1* | 7/2013 | Legros | G01R 27/20 702/65 |
| 2020/0177421 A1* | 6/2020 | Czempas | H04B 17/20 |
| 2021/0035427 A1* | 2/2021 | Thompson | G08B 7/06 |

OTHER PUBLICATIONS

Response to the Written Opinion of the International Preliminary Examining Authority, PCT/ES/2020/070491, 4 pages.

* cited by examiner

MEASURING THE IMPEDANCE IN GROUNDING SYSTEMS

CROSS REFERENCE TO RELATED APPLICATIONS

This application is the U.S. national phase application of, and claims the benefit of and priority to, International (PCT) Patent Application No. PCT/ES2020/070491, filed internationally on Jul. 29, 2020, the entire disclosure of which is hereby incorporated by reference in its entirety.

OBJECT OF THE INVENTION

The object of the present invention consists of methods and devices for measuring the grounding resistance.

BACKGROUND OF THE INVENTION

Traditional grounding resistance measurement methods are mainly based on methods that involve driving auxiliary electrodes into the ground. More recently, methods and equipment have been developed that use the phenomenon of induction to inject current into a loop that is part of the grounding system, so that a measure of the resistance of said loop can be obtained.

Normally the resistance of a loop that is closed by the ground is formed by the sum of the resistance of the conductors and the grounding resistance.

Regardless of the procedure used, the usual technique consists of injecting a direct current "DC" or alternating current "AC" into the ground. In the AC case, some equipment has more than one injection frequency $f_i$, usually close to each other.

Currently, for the measurement of grounding resistance, the two most widespread configurations are:
- By inserting electrodes in the physical ground and circulating an alternating AC or direct DC current between 2 points and reading the potential at the same or other points.
- By using inductive transformers, which induce an electromotive force (EMF) in a loop that is proportional to the resistance of said loop. If this loop is closed by the physical ground, the measure offered by the measure will depend on the grounding resistance.

A document of the state of the art related to the measurement of grounding resistance is CN1133878 which refers to a measurement method where the current injection is generated with stakes using the 62% method and wherein only the Amplitude modulation is used as a functional element for electronics, specifically to control power elements (IGBTs).

U.S. Pat. No. 4,283,794A relates to a method and apparatus for deriving radio-frequency impedance information of an electrical network, for example, an aerial, by using a current converter for inducing a radio-frequency current into the network and a voltage converter for impressing a radio-frequency voltage on the network.

DESCRIPTION OF THE INVENTION

In the proposed procedure, it is intended to perform a frequency sweep in order to obtain the Bode plot in phase and magnitude of the loop of the grounding system to be monitored, for which the injection of a set of frequencies is required, from a few hertz, to at least tens or hundreds of kilohertz in the loop to be monitored as part of the grounding system. Due to the complexity of the reading and adequate filtering of the signals coming from the ground, a method and equipment are proposed to implement it that is characterized in that the current injected into the ground consists of an amplitude modulated wave (AM), whose modulating signal $S_{signal}$ is low-frequency and remains fixed throughout the frequency sweep at one frequency fm, while the carrier signal $S_{carrier}$ varies depending on a range of frequencies F of the desired sweep.

The procedure and equipment to which the invention refers is based on measurement using inductive transformers. In this type of equipment:
- on the one hand, an alternating current (AC) is induced in the loop of the system to be monitored, which is part of the grounding system; and
- on the other hand, the electromotive force induced in said loop is measured, which depends on the resistance of the loop and therefore on the grounding resistance.

In commercially available equipment, it is usual to induce a current of a few hundred hertz, down to a few kilohertz, which gives as a result the value of the impedance at the injection frequency (impedance and resistance only coincide in DC), it being impossible to induce a DC current in a loop by this method. That is why, with this method, the measurement obtained is the impedance at the equipment injection frequency, which implies that different equipment, with different injection frequencies, may offer different results among them.

The procedure and equipment described in the invention is aimed at characterizing the loop to be monitored, which is of special interest in those installations in which there are various functional elements that are connected to the grounding system and that, therefore, are part of the loop, such as the screens of medium voltage insulated cables, distribution towers, etc.

Thus, in a first aspect, the present invention refers to a method for obtaining the impedance of a grounding system that comprises a loop, the method comprises a frequency sweep characterized by a set of frequencies F, typically comprised between tens of hertz to hundreds of kilohertz, preferably F=[100 Hz-500 kHz], applied to the loop of the grounding system, generating a modulating signal, wherein the modulating signal $S_{signal}$, has a fixed frequency fm, for example at a few hundred hertz, preferably fm=220 Hz, generating a carrier signal $S_{carrier}$ that presents a frequency fi that changes and that corresponds to each one of the frequencies of the set of frequencies F of the frequency sweep, such that, fi∈F, obtaining a amplitude modulated signal $S_{modulated}$ based on $S_{signal}$ and $S_{carrier}$, and applying the $S_{modulated}$ signal to the loop of the grounding system.

In addition, the method comprises measuring the electromotive force induced on the loop of the grounding system, wherein said electromotive force has a proportional relationship with the value of the impedance of the grounding system at each of the frequencies fi of the set of frequencies F.

In a second aspect, the invention refers to a device for measuring the impedance of a grounding system according to the preceding claims, comprising a loop, wherein the device comprises a generator of a modulating signal $S_{signal}$ at a frequency fm, a generator of a plurality of carrier signals $S_{carrier}$ with frequencies fi comprised in a range of frequencies F of a frequency sweep, an amplitude modulator configured to obtain a plurality of modulated signals $S_{modulated}$, a current inductor configured to induce in the loop an electromotive force associated to the plurality of modulated signals $S_{modulated}$, a current sensor configured to measure in the loop a set of signals $S_{out}$ associated to the plurality of modulated signals $S_{modulated}$, a demodulator to demodulate the set of signals $S_{out}$ considering the frequency fm, a filter tuned to the frequency fm and configured to obtain demodulated signals $S_{demodulated}$ based on $S_{signal}$ and means for calculating the loop impedance Z (fi) of the grounding system based on $S_{demodulated}$.

DESCRIPTION OF THE DRAWINGS

To complement the description that is being made and in order to help a better understanding of the features of the impedance measurement procedure of a grounding system, according to a preferred example of practical embodiment thereof, a set of drawings is attached as an integral part of said description, wherein, for illustrative and non-limiting purposes, the following has been represented.

PREFERRED EMBODIMENT OF THE INVENTION

Figure 1:
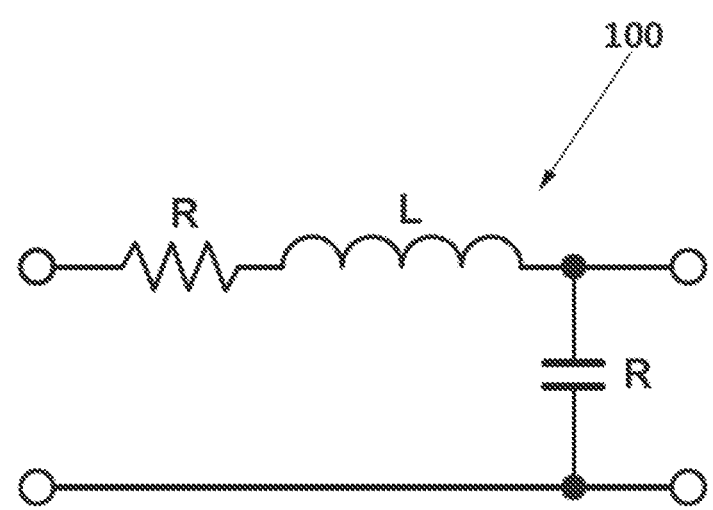
FIG. 1 shows an RLC circuit.

FIG. 1 shows the circuit (100) referring to the characterization of a system determining its resistive (R), inductive (L) and capacitive (C) components, which, in a reduced and compact way, can be expressed as an RLC equivalent.

It is widely known that the transfer function of the circuit (100) of FIG. 1 is given by the following expression, wherein s is the Laplace operator.

$$H(s) = \frac{V_{out}(s)}{V_{in}(s)} = \frac{1}{LCs^2 + RCs + 1}$$

Knowing the morphology of the transfer function of a system and performing a frequency sweep to obtain the Bode plot, it is easy to obtain the asymptotic response to obtain the values of R, L and C, which allows having a complete characterization of the system evaluated.

In an ground loop, wherein there are different interconnected elements, it is important to determine the purely resistive part (R) and separate it from the reactive part (L and C) since most normative prescriptions refer to this parameter R, and not to the impedance Z that contemplates the contribution of the 3 components (Z=f (R, L, C)) and that depends on the frequency used in the method. To obtain this RLC equivalent of the loop to be monitored, the procedure comprises injecting a set of frequencies, from a few hertz to a few hundred kilohertz, that is, a frequency sweep.

Performing a frequency sweep implies the injection of several frequencies and subsequently the reading of those same frequencies, for which it is necessary to interpose filters that eliminate all those frequencies that do not constitute useful information and, given that there is a set of frequencies of interest, the set of filters shall be tuned to each of these frequencies of interest, which implies a number of filters tuned as high as the number of frequencies to be included in the sweep. Another possible solution is to use a configurable or programmable filter, which is also complex.

Figure 2:
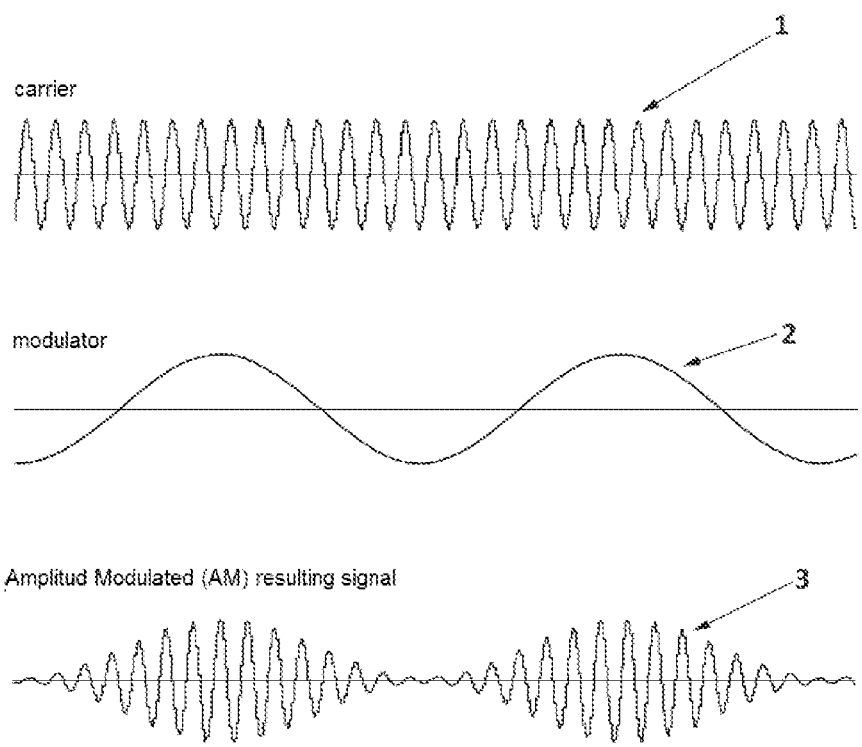
FIG. 2 shows three signals involved in an amplitude modulation.

Advantageously, to simplify the filtering process, the procedure to which the invention refers comprises the use of the amplitude modulation (AM) technique as shown in FIG. 2, which involves a carrier wave $S_{carrier}$ (1), usually, of high frequency fi in the frequency range and a modulating wave $S_{signal}$ (2), of lower frequency fm. Amplitude modulation results in the modulated signal $S_{modulated}$ (3) wherein the frequency fi of the carrier wave $S_{carrier}$ (1) in the range F and the fixed frequency fm of the modulator wave $S_{signal}$ (2) are reflected.

Thus, in the measurement method according to the present invention the modulator $S_{signal}$ (2) is introduced at a fixed frequency fm and the carrier $S_{carrier}$ (1) at a frequency fi will frequently vary in the frequency range of the sweep in frequencies fi∈F (from few hertz, up to hundreds of kilohertz).

A parameter to take into account in this process is the modulation index (m), which is defined as the ratio of amplitudes between the carrier signal ($S_{carrier}$ (1)) and the modulating signal ($S_{signal}$ (2)):

$$m = \frac{S_{signal}\ (1)}{S_{carrier}\ (2)}$$

Figure 3:
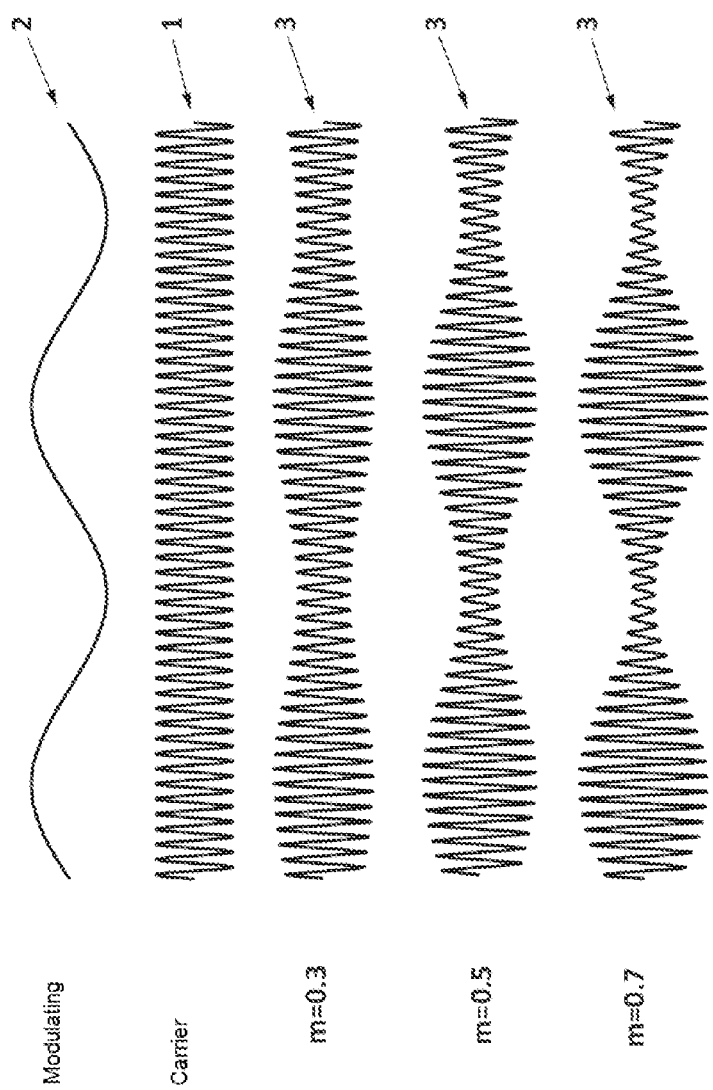
FIG. 3 shows examples of the effect of modulation index on the AM modulation process.

The modulation index m is an indicator of the morphology of the modulated signal $S_{modulated}$ as can be seen in FIG. 3, wherein the carrier signal $S_{carrier}$ (1) and $S_{signal}$ (2) are the same in the three modulated signals $S_{signal}$ (2) with different amplitude relationships and therefore with different modulation indices m=(0.3, 0.5 and 0.7), respectively.

The measurement procedure according to the present invention offers a set of values Z,Z(fi), based on the calculation of the modulation index m, at each of the frequencies fi that are part of the sweep of frequencies F and whose graphic representation corresponds to the Bode plot in amplitude of the loop impedance.

In addition, the procedure also offers a set of offset values φ, φ(fi) and whose graphical representation corresponds to the Bode plot in phase of the loop impedance.

Obtaining the Bode plot will be based on putting in a table (in the internal memory of the microcontroller) the values of the impedance and the offset measured at each of the frequencies of the sweep. Subsequently, the graphical representation of each impedance and offset value (Y axis) for each frequency (X axis) will result in the Bode plot in magnitude and phase.

The main advantage of the method according to the present invention is its immunity against noise, so that the filtering in the reading process can be made fixed and highly selective with very simple and known procedures, without having to resort to multiple filters. or configurable filters, this means greater reliability and less processing time.

Another advantage is the possibility of expanding the frequency range, since the use of a filtering tuned to the fixed frequency of the modulator is possible, it would not be necessary to add or modify the part for filtering and demodulating the signal for this purpose.

Figure 4:
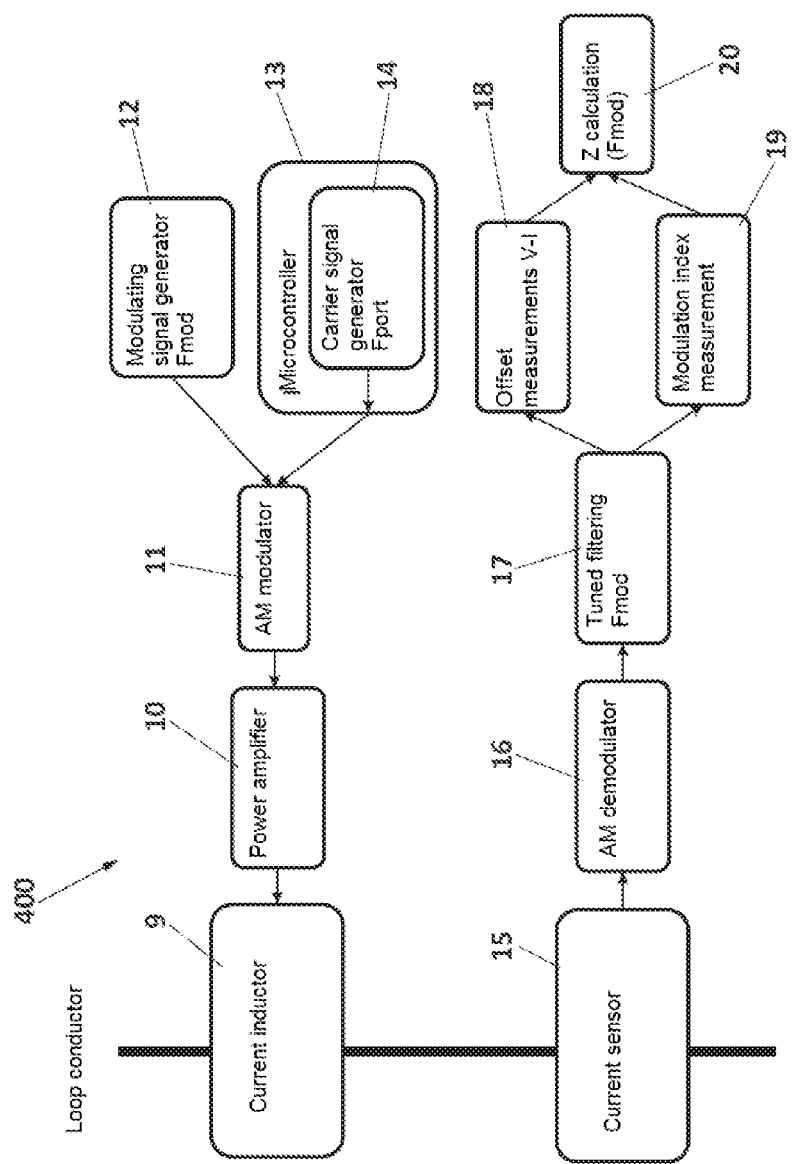
FIG. 4 shows a device for measuring the impedance of a grounding system according to the present invention.

FIG. 4 shows the measurement equipment (400) according to the present invention. In particular, the measurement equipment 400 is used in a loop as part of a grounding system. The measuring equipment (400) comprises a generator (12) of the modulating signal $S_{signal}$ (2) at the fixed frequency fm. A microcontroller (13) comprising a carrier signal $S_{carrier}$ (1) generator with various frequencies within a range F used in a frequency sweep to characterize the impedance of the grounding system.

In addition, the measuring equipment (400) comprises an amplitude modulator (11) to obtain a amplitude modulated signal $S_{modulated}$ (3) at the frequency fi based on $S_{signal}$ (2) and $S_{carrier}$ (1), optionally a power amplifier (10), and a current inductor (9) configured to induce an electromotive force (emf) in the loop conductor of the grounding system.

In addition, the measuring equipment (400) comprises a current sensor (15) for measuring the electromotive force induced in said loop identified as $S_{out}$ and which is a composition of $S_{modulated}$ (3) combined with noise and after having suffered alterations typical of the impedance of the loop, through which it propagates, a demodulator (16) in amplitude, a filter (17) tuned to the frequency fm of the modulating signal $S_{signal}$, means (20) for obtaining the impedance Z (fi), in particular means (18) for measuring the offset φ(fi) of the demodulated signal $S_{demodulated}$, preferably a phase locked loop "PLL" and for each of the frequencies of the sweep of frequencies F, which allows complementing the Bode plot obtained with the measurement of the modulation index m. Furthermore, the measuring equipment (400) comprises means (19) for calculating the modulation index m:

$$m = \frac{S_{demodulated}}{S_{carrier}} \quad (1)$$

Advantageously, the measuring equipment (400) can perform a frequency sweep by injecting several frequencies corresponding to the sweep of frequencies F through amplitude modulated signals and subsequently, after demodulation, reading the demodulated signal at the frequency fm of the modulating signal $S_{signal}$ (2), for which it is sufficient to include a single filter (17) tuned to the frequency fm of the modulating signal $S_{signal}$ (2)

The invention claimed is:

1. Method for measuring the impedance of a grounding system that comprises a loop, the method comprising:
    for each frequency fi of a set of frequencies F, of a frequency sweep applied to the loop of the grounding system:
        generating, using a first generator, a modulating signal $S_{signal}$ (2) with a fixed frequency fm, preferably fm=220 Hz;
        generating a carrier signal $S_{carrier}$ (1) with the frequency fi;
        obtaining, via an amplitude modulator, an amplitude modulated signal $S_{modulated}$ (3) with frequency components of the frequencies fm and fi based on $S_{signal}$ (2) and $S_{carrier}$ (1);
        inducing, using a current inductor, the signal $S_{modulated}$ (3) in the loop of the grounding system; and
        measuring, using a current sensor, a signal $S_{out}$ based on the signal $S_{modulated}$ (3) in said loop of the grounding system;
        demodulating, using a demodulator, the signal $S_{out}$, eliminating the carrier signal $S_{carrier}$ (1);
        filtering, using a filter, the signal $S_{out}$ in a frequency tuned way to obtain a demodulated signal $S_{demodulated}$ at the frequency fm based on $S_{signal}$ (2);
        obtaining, using a microcontroller, an impedance Z (fi) of the grounding system based on the demodulated signal $S_{demodulated}$;
    wherein obtaining the impedance Z (fi) of the grounding system based on the demodulated signal $S_{demodulated}$ comprises calculating a modulating index $$m = \frac{S_{demodulated}}{S_{carrier}} \quad (1)$$

based on the demodulated signal $S_{demodulated}$,
    wherein the modulating index m is defined as the ratio of amplitudes,
        obtaining, using the microcontroller, a phase measurement φ(fi) based on the respective demodulated signal $S_{demodulated}$ for each frequency fi; and
        obtaining, using the microcontroller, for the set of frequencies F a Bode plot based on Z(fi), φ(fi), and the modulating index m of each frequency fi, respectively.

2. Device (400) configured to measure the impedance of a grounding system, comprising a loop, wherein the device (400) comprises:
    a generator (12) configured to generate a modulating signal $S_{signal}$ (2) at a frequency fm;
    a generator (13) configured to generate a plurality of carrier signals $S_{carrier}$ (1) with frequencies fi comprised in a set of frequencies F of a frequency sweep;
    an amplitude modulator configured to obtain a plurality of modulated signals $S_{modulated}$ (3);
    a current inductor (9) configured to induce in the loop respective electromotive forces associated with the plurality of modulated signals $S_{modulated}$ (3);
    a current sensor (15) configured to measure in the loop a set of signals $S_{out}$ associated with the plurality of modulated signals $S_{modulated}$ (3);
    a demodulator (16) configured to demodulate the set of signals $S_{out}$ considering the frequency fm;
    a filter (17) tuned to the frequency fm and configured to obtain demodulated signals $S_{demodulated}$ based on $S_{signal}$ (2);
    a first microcontroller for: calculating the impedance Z (fi) of the grounding system based on the demodulated signals $S_{demodulated}$;
    obtaining for each frequency fi a phase measurement φ(fi) of the demodulated signal $S_{demodulated}$;
    calculating a modulating index $$m = \frac{S_{demodulated}}{S_{carrier}} \quad (1)$$

for each frequency fi,
    wherein the modulating index m is defined as the ratio of amplitudes, and
    obtaining for the set of frequencies F a Bode plot based on Z (fi), φ(fi), and the modulating index m of each frequency fi, respectively.

3. The device (400) of claim 2, wherein the generator (13) of the plurality of carrier signals $S_{carrier}$ (1) is configured as part of a second microcontroller.

4. The device (400) of claim 2, wherein the microcontroller comprises an internal memory preferably configured to store Z (fi) and φ(fi) obtained for each frequency fi of the set of frequencies F of the frequency sweep.

5. The device (400) of claim 2 further comprising a power amplifier (10) configured to amplify the plurality of modulated signals $S_{modulated}$ (3).

* * * * *